(12) United States Patent
Takano et al.

(10) Patent No.: US 8,278,129 B2
(45) Date of Patent: Oct. 2, 2012

(54) MANUFACTURING METHOD OF NITRIDE SEMI-CONDUCTOR LAYER, AND A NITRIDE SEMI-CONDUCTOR LIGHT EMITTING DEVICE WITH ITS MANUFACTURING METHOD

(75) Inventors: Takayoshi Takano, Kawanishi (JP); Kenji Tsubaki, Katano (JP); Hideki Hirayama, Asaka (JP); Sachie Fujikawa, Osaka (JP)

(73) Assignees: Panasonic Corporation, Osaka (JP); Riken, Saitarra (JP)

( * ) Notice: Subject to any disclaimer, the term of this patent is extended or adjusted under 35 U.S.C. 154(b) by 30 days.

(21) Appl. No.: 12/622,085

(22) Filed: Nov. 19, 2009

(65) Prior Publication Data
US 2010/0270583 A1  Oct. 28, 2010

(30) Foreign Application Priority Data

Apr. 22, 2009 (JP) ................................. 2009-104408

(51) Int. Cl.
*H01L 21/00* (2006.01)
(52) U.S. Cl. ............................................ 438/47; 438/46
(58) Field of Classification Search ............... 438/46–47
See application file for complete search history.

(56) References Cited

U.S. PATENT DOCUMENTS

| | | | | |
|---|---|---|---|---|
| 5,751,013 A | * | 5/1998 | Kidoguchi et al. | 257/13 |
| 6,335,217 B1 | * | 1/2002 | Chiyo et al. | 438/46 |
| 2002/0045286 A1 | * | 4/2002 | Koide et al. | 438/46 |

FOREIGN PATENT DOCUMENTS

JP  2005-340856 A  12/2005

* cited by examiner

*Primary Examiner* — Richard A. Booth
(74) *Attorney, Agent, or Firm* — Cheng Law Group, PLLC

(57) ABSTRACT

In a process of fabricating a nitride nitride semi-conductor layer of $Al_aGa_bIn_{(1-a-b)}N$ (0<a<1, 0<b<1, 1−a−b>0), the AlGaInN layer is grown at a growth rate less than 0.09 μm/h according to the metal organic vapor phase epitaxy (MOPVE) method. The AlGaInN layer fabricated by the process in the present invention exhibits a high quality with low defect, and increases internal quantum yield.

5 Claims, 8 Drawing Sheets

MANUFACTURING METHOD OF NITRIDE SEMI-CONDUCTOR LAYER, AND A NITRIDE SEMI-CONDUCTOR LIGHT EMITTING DEVICE WITH ITS MANUFACTURING METHOD

TECHNICAL FIELD

This invention relates to a manufacturing method of nitride semi-conductor layer of AlGaInN, and a nitride semi-conductor light emitting device with its manufacturing method using AlGaInN.

BACKGROUND ART

A nitride semi-conductor light emitting device which emits light in UV-visible region is expected to be widely applied, hygienically, medically, industrially, and has been studied to develop an illumination device, a precision machine or the like, for its compact size and its low electrical consumption. The light emitting device which emits light in specific region including blue-color region has already been developed for practical use.

For development of the nitride semi-conductor light emitting device (including that emitting blue light which is referred to as a blue-color light emitting diode), it is necessary to further improve its light emission efficiency and light output. At present, the semi-conductor light emitting device provides much smaller external quantum efficiency and light output in UV region than blue-color region. The very small external quantum efficiency and light output have been obstacles to practical use of the light emitting device in UV region, and are possibly attributed to very low light emission efficiency in light emission layer (referred to as internal quantum efficiency, hereafter) and high resistance in an n-type and p-type nitride semi-conductor layers.

Due to transition, point defect, and unintended impurity which are formed in large amount in the light emission layer, the nitride semi-conductor (nitride mixed crystal) has very low internal quantum efficiency. Especially, ternary mixed crystal including Al such as AlGaN has considerably low internal quantum efficiency, for difficulty in growth of the mixed crystal with high quality. Instead, a quaternary mixed crystal AlGaInN has been attracted as an mixed crystal which is less affected by the transition and the point defect than AlGaN, for improving the internal quantum efficiency and light intensity.

A UV LED has been proposed for being utilized as a component of the nitride semi-conductor light emitting device. The UV LED is designed to emit light in 280 to 360 nm at room temperature. The UV LED as the light emitting device has an $Al_aGa_bIn_cN(0.1 \leq a \leq 0.9, 0.02 \leq c \leq 0.2, a+b+c=1)$ layer grown at growth temperature of 830 to 950° C. A UV LED of JP unexamined patent publication 2005-340856 has an AlGaInN layer which emits light with higher intensity than that emitted from a conventional AlGaN layer. The growth rate of the AlGaInN layer is set at 0.12 μm/h by metal organic vapor phase epitaxy (MOVPE) method.

However, the internal quantum efficiency in the light emission layer is still low in this LED in JP unexamined patent publication 2005-340856, and required to be further improved.

The Al-containing nitride semi-conductor layer is generally grown at a high temperature of 1000° C. or more. For example, growth temperature is generally set at 1150° C. or more for growth of AlN layer, or 1000 to 1200° C. for growth of AlGaN layer.

In the UV LED including AlGaInN layer of JP Unexamined patent publication 2005-340856, the growth temperature needs to be set at 830 to 950° C. below 1000° C. When the growth rate is set at 0.12 μm/h under such a low temperature, Al atoms are not migrated sufficiently through a surface of single crystal substrate in its crystal growth, thereby often generating voids and point defects particularly in growth of AlGaInN layer having a high concentration of Al. The point-defect causes a sharp decrease in the internal quantum efficiency.

DISCLOSURE OF THE INVENTION

The present invention has been accomplished in view of the above problem, and is intended to provide a manufacturing method of nitride semi-conductor layer of AlGaInN, and a nitride semi-conductor light emitting device with its manufacturing method using AlGaInN, for improving quality of a light emission layer made of AlGaInN and increasing internal quantum yield.

In a process of fabricating a nitride nitride semi-conductor layer of $Al_aGa_bIn_{(1-a-b)}N(0<a<1, 0<b<1, 1-a-b>0)$, the AlGaInN layer is grown at a growth rate less than 0.09 μm/h according to the metal organic vapor phase epitaxy (MOPVE) method. Compared to a conventional AlGaInN layer grown at a rate of 0.12 μm/h. the AlGaInN layer in the present invention exhibits a high quality with low defect, and allows Al atoms to sufficiently migrate in its surface.

In production of a nitride semi-conductor light emitting device which includes a p-type nitride semi-conductor layer, an n-type nitride semi-conductor layer, and a light emission layer, the light emission layer is preferably formed according to the above process of fabricating $Al_aGa_bIn_{(1-a-b)}N$ layer. In this invention, the process of fabricating the light emission layer of $Al_aGa_bIn_{(1-a-b)}N$ enables to suppress the generation of point-defects which significantly lowers quality of the light emission layer, thereby improving quality, internal quantum efficiency, and high light output of the light emission layer.

In production of the above nitride semi-conductor light emitting device, the p-type nitride semi-conductor layer is preferably formed according to the above process of fabricating $Al_aGa_bIn_{(1-a-b)}N$ layer. In this invention, the process of fabricating the p-type nitride semi-conductor layer of $Al_aGa_bIn_{(1-a-b)}N$ layer enables to suppress the generation of point-defects which significantly lowers quality of the p-type nitride semi-conductor layer, thereby improving its quality and its electrical property.

The nitride semi-conductor light emitting device is preferably produced by the process of producing nitride semi-conductor light emitting device, in which the composition a in the $Al_aGa_bIn_{(1-a-b)}N$ layer is set at 0.3 or more. In this invention, the nitride semi-conductor light emitting device exhibits a high quality, compared to a conventional light emitting device.

In the nitride semi-conductor light emitting device, the light emission layer is preferably set to emit light having its wavelength of 250 to 300 nm. In this invention, the nitride semi-conductor light emitting device can be utilized as an UV LED alternative to a mercury lamp, excimer lamp, or the like.

MODE FOR CARRYING OUT THE INVENTION

Figure 1:
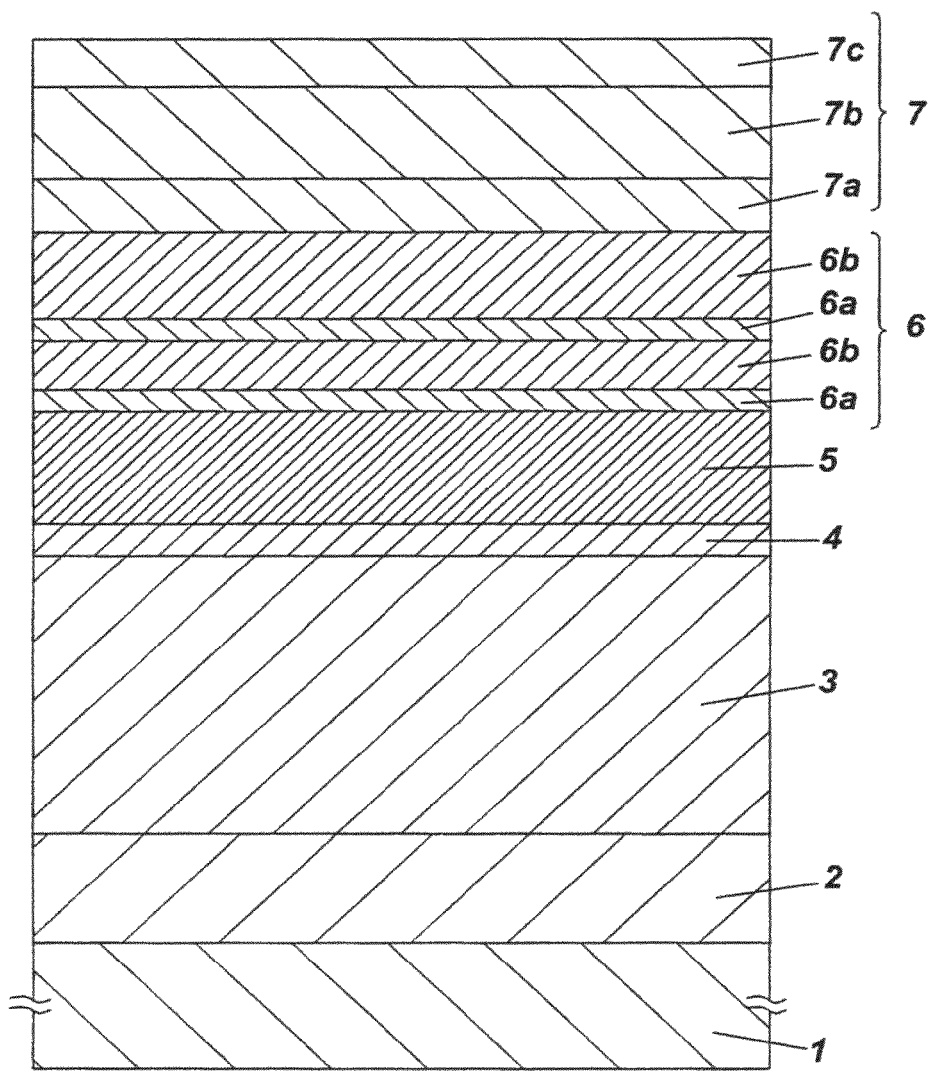
FIG. 1 shows a schematic sectional view of a nitride semi-conductor light emitting device in an embodiment.

A nitride semi-conductor light emitting device in this embodiment is a UV-LED and includes a single crystal substrate 1 for epitaxial growth, a first buffer layer 2, an n-type nitride semiconductor layer 3, a second buffer layer 4, a third buffer layer 5, a light emission layer 6, and a p-type nitride semi-conductor layer 7, which are superimposed in this order on the single crystal substrate 1, as shown in FIG. 1. A cathode (not shown) and an anode (not shown) are provided respectively on the n-type nitride semiconductor layer 3 and the p-type nitride semiconductor layer 7.

The single crystal substrate 1 is formed of a sapphire substrate with a (0001) surface (i.e., c-surface) serving as a mounting surface.

The first buffer layer 2 is formed of a single crystal of AlN layer having its thickness of 2.5 μm, acting to suppress threading dislocation and residual distortion of the n-type nitride semi-conductor layer 3. The thickness of first buffer 2 is not limited to 2.5 μm.

Prior to formation of the first buffer layer 2, the single crystal substrate 1 formed of sapphire substrate is set in a reaction chamber of MOVPE apparatus. Then, the single crystal substrate is heated up to a specific temperature (e.g., 1250° C.) for a predetermined time (e.g., 10 minutes) with interior of the reaction chamber being kept in a predetermined growth pressure (e.g., 10 kPa=76 Torr), for being made clean in its mounting surface. Subsequently, the reaction chamber is filled with trimethylaluminum (TMAl) as a source of Al in a predetermined amount (0.05 L/min (50 SCCM) under standard state) and $NH_3$ as a source of nitrogen in a predetermined amount (0.05 L/min (50 SCCM) under standard state) at the same time, in keeping substrate temperature in a predetermined temperature equal to the above specific temperature (i.e., 1250° C.), so as to grow the first buffer layer 2 made of AlN single crystal on the mounting surface of single crystal substrate 1. As a material of the first buffer layer 2, the present invention is not limited to the AlN single crystal, but may be AlGaN single crystal.

The n-type nitride semi-conductor layer 3 is formed of Si-doped n-type $Al_{0.55}Ga_{0.45}N$ layer on the first buffer layer 2. The n-type nitride semi-conductor layer 3 is set to have its thickness of 2 μm in this embodiment, but the present invention is not limited to the thickness. The n-type nitride semi-conductor layer 3 is not limited to a single layer, but may be a multilayer which is formed of an Si-doped n-type $Al_{0.7}Ga_{0.3}N$ layer and an Si-doped n-type $Al_{0.55}Ga_{0.45}N$ layer formed on the Si-doped n-type $Al_{0.7}Ga_{0.3}N$ layer, or the like.

In growth of the n-type nitride semi-conductor layer 3, the growth temperature is set at 1100° C., the growth pressure is set at a predetermined value (herein, 10 kPa). TMAl, trimethylgallium (TMGa), $NH_3$, and tetraethylsilane (TESi) are employed respectively as sources of Al, Ga, N, and Si which is provided as an impurity for exhibiting n-type electrical property. $H_2$ and $N_2$ gases are employed as carrier gases for carrying the materials. TESi is filled in a predetermined amount 0.0009 L/min (0.9 SCCM) under standard state. The present invention is not limited to these materials. For example, triethylgallium (TEGa), hydrazine derivatives, and monosilane ($SiH_4$) may be employed respectively as sources of Ga, N, and Si.

The second buffer layer 4 is provided to suppress threading dislocation and residual distortion of the light emission layer 6, and formed of AlGaInN layer having its thickness of 3 nm. Herein, the second buffer layer 4 is set to have its specific composition for achieving a desired band gap energy of 4.7 eV. The present invention is not limited to the band gap energy, but the second buffer layer 4 should be set not to absorb therein light which is emitted from the light emission layer 6. The present invention is not limited to the thickness of 3 nm for the second buffer layer 4.

In growth of the second buffer layer 4, the growth temperature is set at 800° C., the growth pressure is set at a predetermined value (herein, 10 kPa). TMAl, TMGa, trimethylindium (TMIn), and $NH_3$ are employed respectively as sources of Al, Ga, In, and N. $N_2$ gas is employed as a carrier gas for carrying the materials. The second buffer layer 4 of AlGaInN is grown at a growth rate of 0.03 μm/h.

The third buffer layer 5 is formed of Si-doped n-type AlGaInN layer having its thickness of 18 nm, acting to suppress threading dislocation and residual distortion of the light emission layer 6. The third buffer layer 5 also acts to improve planarity of the light emission layer 6, and to relieve piezo electrical field of the light emission layer 6 by utilizing carriers generated in the third buffer layer. Namely, the third buffer layer 5 and the second buffer layer 4 are formed of same metal composition, and need to be formed so as to absorb thereinto the light which is emitted from the light emission layer 6. The third buffer layer 5 is set to have its thickness of 18 nm, but the present invention is not limited to the thickness.

In growth of the third buffer layer 5, the growth temperature is set at 800° C., the growth pressure is set at a predetermined value (herein, 10 kPa). TMAl, TMGa, TMIn, $NH_3$, and TESi are employed respectively as sources of Al, Ga, In, N, and Si. $N_2$ gas is employed as a carrier gas for carrying the materials. TESi is filled in a predetermined amount 0.0009 L/min (0.9 SCCM) under standard state. The third buffer layer 5 of AlGaInN is grown at a growth rate of 0.03 μm/h.

The light emission layer 6 is formed of an AlGaInN quantum well structure having two barrier layers 6b and two well layers 6a which are alternatively superimposed. In this embodiment, the light emission layer 6 is formed of a multi-quantum well structure, but may be formed of a single quantum well structure. In the light emission layer 6 of this embodiment, each of the well layers 6a is formed of AlGaInN layer having its thickness of 1.7 nm. The barrier layer 6b between two well layers 6a is formed of Si-doped AlGaInN layer having its thickness of 7 nm. The barrier layer 6b between the well layer 6a and the p-type nitride semi-conductor layer 8 is formed of Si-doped AlGaInN layer having its thickness of 14 nm (twice thickness of the barrier layer 6b between two well layers 6a). The present invention is not limited to these thicknesses of the well 6a and the barrier layers 6b. In the light emission layer 6 of this embodiment, Si is added as an impurity to the barrier layer 6b. In the present invention, content of Si is not limited, and the addition of Si is not always required. The barrier layer 6b is set to have its predetermined composition ($Al_aGa_bIn_{(1-a-b)}$, a≈0.6) for achieving a desired band gap energy of 4.7 eV. The well layer 6a is set to have its predetermined composition ($Al_aGa_bIn_{(1-a-b)}$, a≈0.35) for achieving a desired band gap energy of 4.4 eV. The present invention is not limited to the compositions of the barrier and well layers, but need to be set in accordance with a desired wavelength of light (e.g., 250 to 300 nm). The number of well layers 6a is not limited to two, but may be other. For example, the light emission layer 6 may be formed of a single quantum well including a single well layer 6a.

In growth of the light emission layer 6, the growth temperature is set at 800° C., the growth pressure is set at a predetermined value (herein, 10 kPa). TMAl, TMGa, TMIn, $NH_3$, and TESi are employed respectively as sources of Al, Ga, In, N, and Si. $N_2$ gas is employed as a carrier gas for carrying the materials. TESi is supplied into the chamber in a predetermined amount of 0.0009 L/min (0.9 SCCM) under standard state only for growth of the barrier layer 6b. In growth of the light emission layer 6, each of supply rates of the materials needs to be controlled such that the well layer 6a and the barrier layer 6b have different composition of Group III metals. TMAl is supplied in a predetermined amount of 0.008 L/min (8 SCCM) under standard state for growth of the barrier layer 6b, and in 0.001 L/min (1 SCCM) under standard state for growth of the well layer 6a. Both of the well layer 6a and the barrier layer 6b are grown at a growth rate of 0.03 μm/h. The barrier layer 6b and the third buffer layer 5 have same metal composition, enabling to grow the lowest barrier layer 6b of the light emission layer 6 continuously after the growth of the third buffer layer 5.

The p-type nitride semi-conductor layer 7 includes a first p-type nitride semi-conductor layer 7a composed of Mg-doped p-type AlGaInN, a second p-type nitride semi-conductor layer 7b composed of Mg-doped p-type AlGaInN, and a third p-type nitride semi-conductor layer 7c composed of Mg-doped p-type $In_{0.03}Ga_{0.97}N$. The first p-type nitride semi-conductor layer 7a is formed on the light emission layer 6, and set to have its band gap energy larger than that of the second p-type nitride semi-conductor layer 7b by control of metal compositions of first and second p-type nitride semi-conductor layers 7a,7b. The second p-type nitride semi-conductor layer 7b is set to have the specific metal composition so as to achieve the same band gap as that of the barrier layer 6b. The first, second, and third p-type nitride semi-conductor layers 7a,7b,7c are respectively set to have their thicknesses of 15, 55, and 15 nm, but the present invention is not limited to the thicknesses.

In growth of the first, second, and third p-type nitride semi-conductor layers 7a,7b,7c, the growth temperature is set at 800° C., and the growth pressure is set at a predetermined value (herein, 10 kPa). TMAl, TMGa, TMIn, $NH_3$, and bis-cyclopentadienyl magnesium ($Cp_2Mg$) are employed respectively as sources of Al, Ga, In, N, and Mg. TMAl as a source of Al is supplied in growth of the first and second p-type nitride semi-conductor layers 7a,7b, while the supply of TMAl is stopped in growth of the third p-type nitride semi-conductor layer 7c. In growth of each p-type nitride semi-conductor layer, $N_2$ gas is employed as a carrier gas for carrying the materials, $Cp_2Mg$ is supplied in 0.02 L/min (20 SCCM) under standard state. In growth of the first, second, and third p-type nitride semi-conductor layers 7a,7b,7c, each of supply rates of the materials needs to be controlled, in accordance with desired metal compositions thereof. The growth rate of first and second p-type nitride semi-conductor layers 7a,7b are set at 0.03 μm/h.

Figure 2:
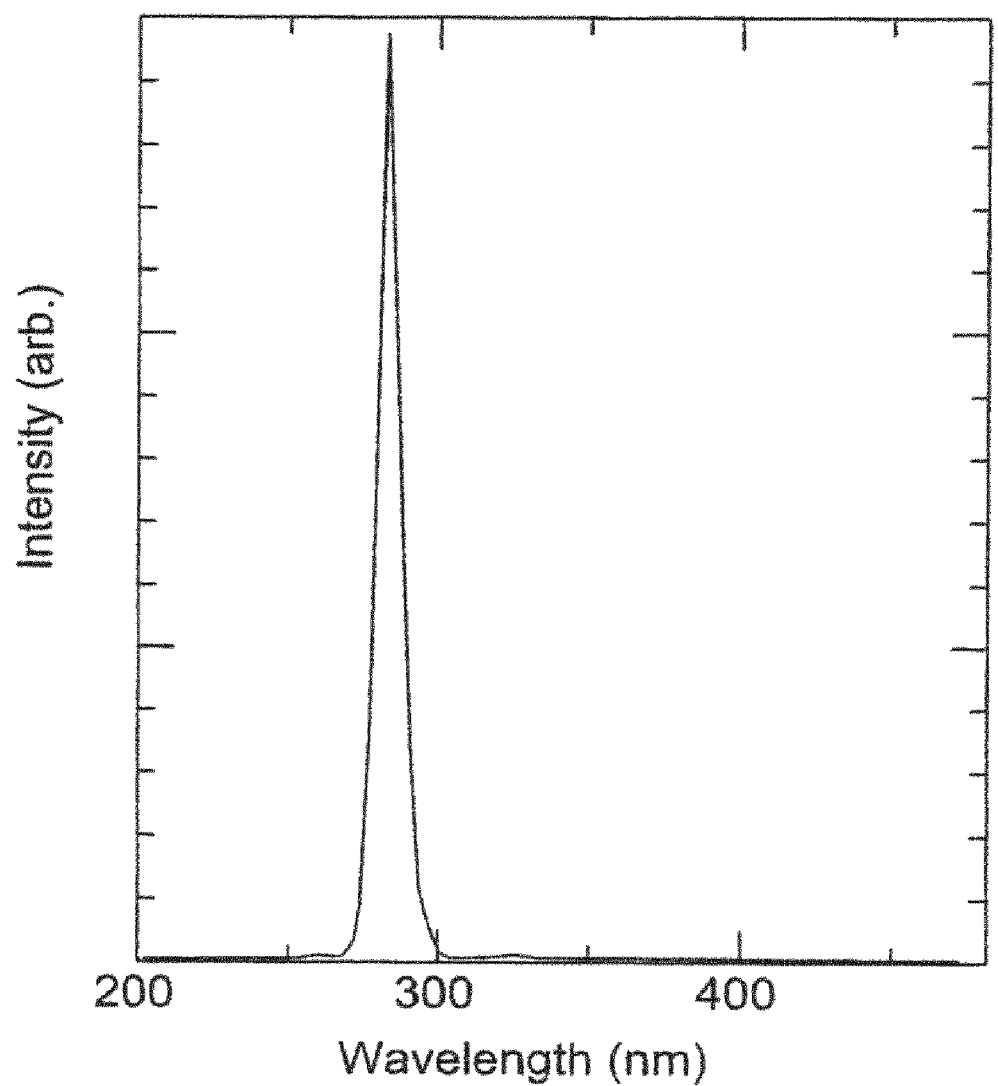
FIG. 2 shows a luminescent spectrum of an example of the above nitride semi-conductor light emitting device, in response to injection of electric current.
Figure 3:
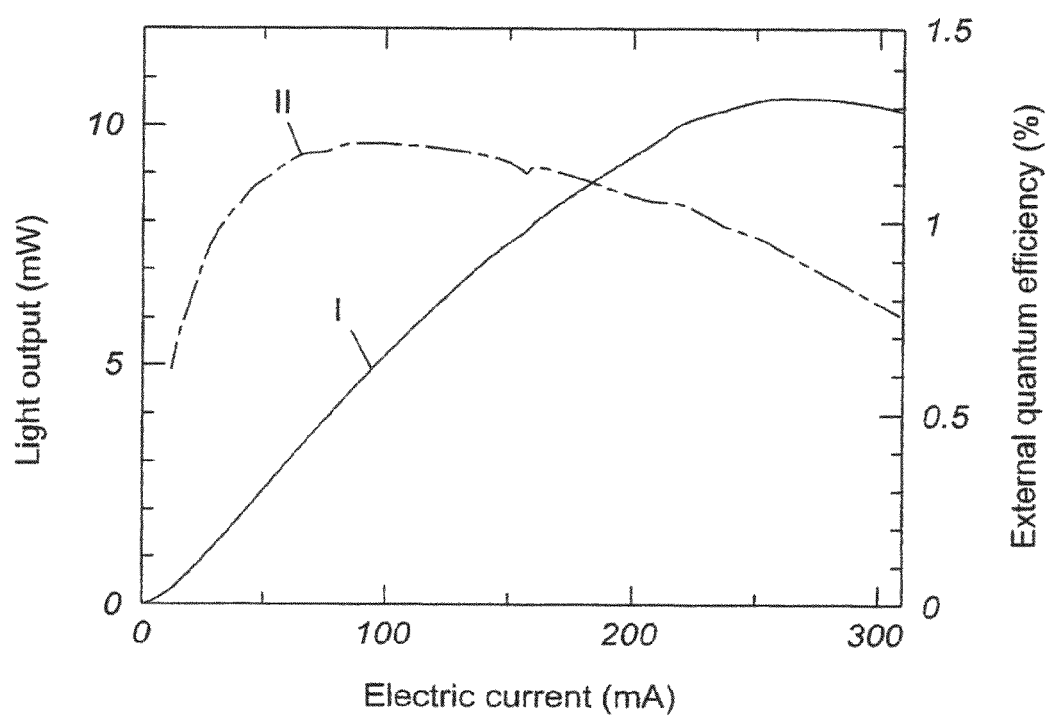
FIG. 3 shows variations of light output and external quantum efficiency in relation to the electric current, in the above example of the nitride semi-conductor light emitting device.

FIG. 2 shows a luminescent spectrum in response to injection of electric current, for the nitride semi-conductor light emitting device including the above layers 2 to 7 (referred to as an example). FIG. 3 shows variations of light output (solid line) and external quantum efficiency (broken line) in response to the injection of electric current in room temperature, which is measured for this example of the nitride semi-conductor light emitting device.

According to FIG. 2, nitride semi-conductor light emitting device in this example emits light having its peak at 280 nm in short wavelength UV region. In FIG. 3, the solid line (denoted by I) shows a relation between the electric current and the light output, and the light output has the maximum of 10.6 mW. The broken line (denoted by II) shows a relation between the electric current and the external quantum efficiency, and the external quantum efficiency has the maximum of 1.2%.

Figure 4:
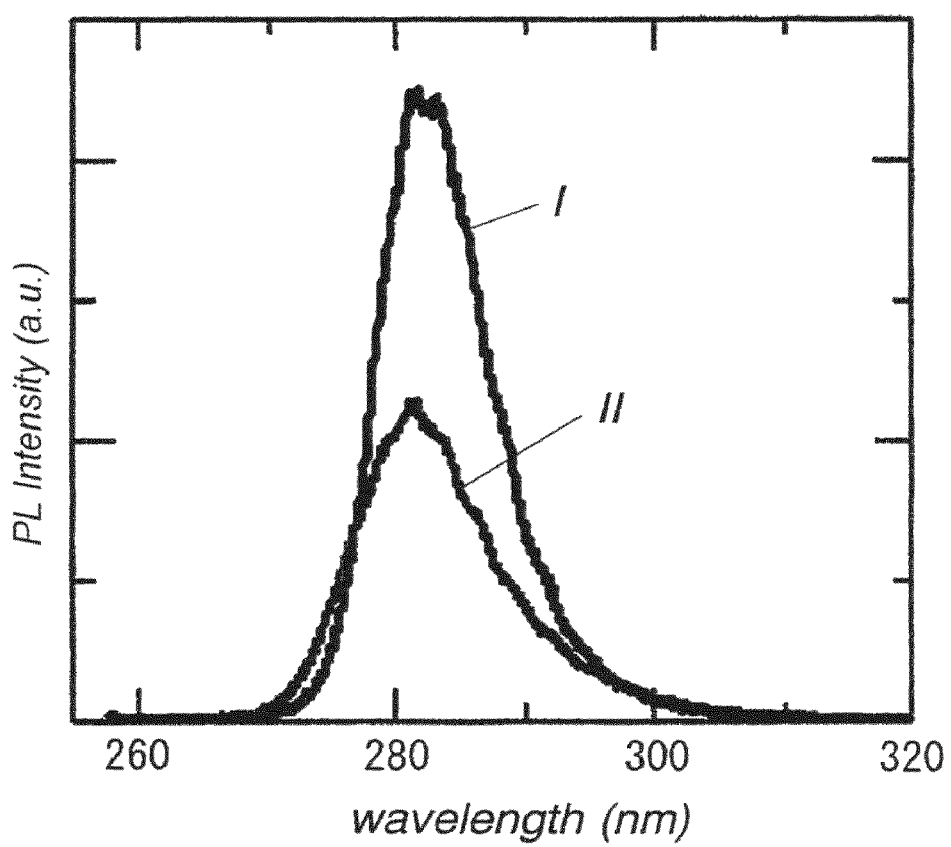
FIG. 4 shows a photoluminescence spectrum of a light emission layer in the above nitride semi-conductor light emitting device.

In order to examine a relation between growth rate and luminescent characteristic of AlGaInN layer, the sapphire substrate 1 is formed with the first buffer layer 2, the n-type nitride semi-conductor layer 3, and an AlGaInN layer having a thickness of 180 nm which are superimposed in this order by MOVPE. Then, two kinds of photoluminescence (PL) spectra are measured at room temperature for the resultant products respectively including AlGaInN layers which are grown at different growth rates of 0.06 μm/h (denoted by I) and 0.09 μm/h (denoted by II), as shown in FIG. 4. The growth rate is controlled by supply rate of $NH_3$ as a source of nitrogen, in growth of AlGaInN layer.

As the growth rate is set low, intensity of PL increases, according to FIG. 4. The large intensity of PL spectra of the AlGaInN layer which is grown at low growth rate may be attributed to a sufficient surface migration of Al atoms and to decrease in non-radiative recombination due to defects in AlGaInN.

In process of fabricating nitride semi-conductor light emitting device made of the $Al_aGa_bIn_{(1-a-b)}N$ layer (0<a<1, 0<b<1, 1−a−b>0), the nitride semi-conductor layer is grown on the single crystal substrate 1 by MOVPE at a growth rate less than 0.09 μm/h. The resultant semi-conductor layer allows Al atoms to sufficiently migrate in its surface, exhibiting a high quality with small amount of defects, compared to a conventional AlGaInN layer grown at a rate of 0.12 μm/h.

Figure 5:
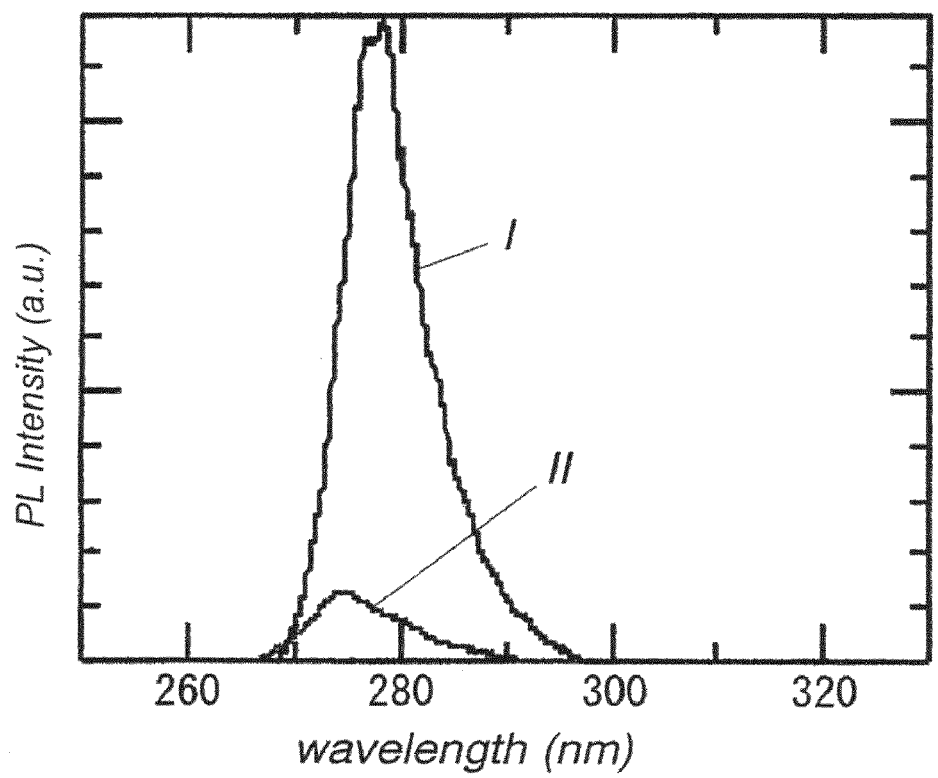
FIG. 5 shows a photoluminescence spectrum of the light emission layer in the above nitride semi-conductor light emitting device.

In order to examine a relation between growth rate and luminescent characteristic of the light emission layer 6 which includes the well layer 6a and the barrier layer 6b respectively made of AlGaInN, the single crystal 1 is formed with the above layers 2 to 6 (except the p-type nitride semi-conductor layer 7) which are superimposed in the above order, as in FIG. 1, to expose the light emission layer 6. Then, two kinds of photoluminescence (PL) spectra are measured at room temperature for the resultant products including AlGaInN layers which are grown at different growth rates of 0.03 μm/h (denoted by I) and 0.05 μm/h (denoted by II), as shown in FIG. 5. The growth rate is controlled by supply rate of $NH_3$ as a source of nitrogen, in growth of AlGaInN layer.

As the growth rate of the light emission layer 6 of AlGaInN is set low, intensity of PL increases, according to FIG. 5. The large intensity of PL spectra of the AlGaInN layer which is grown at low growth rate may be attributed to decrease in non-radiative recombination due to defects in AlGaInN.

Figure 6:
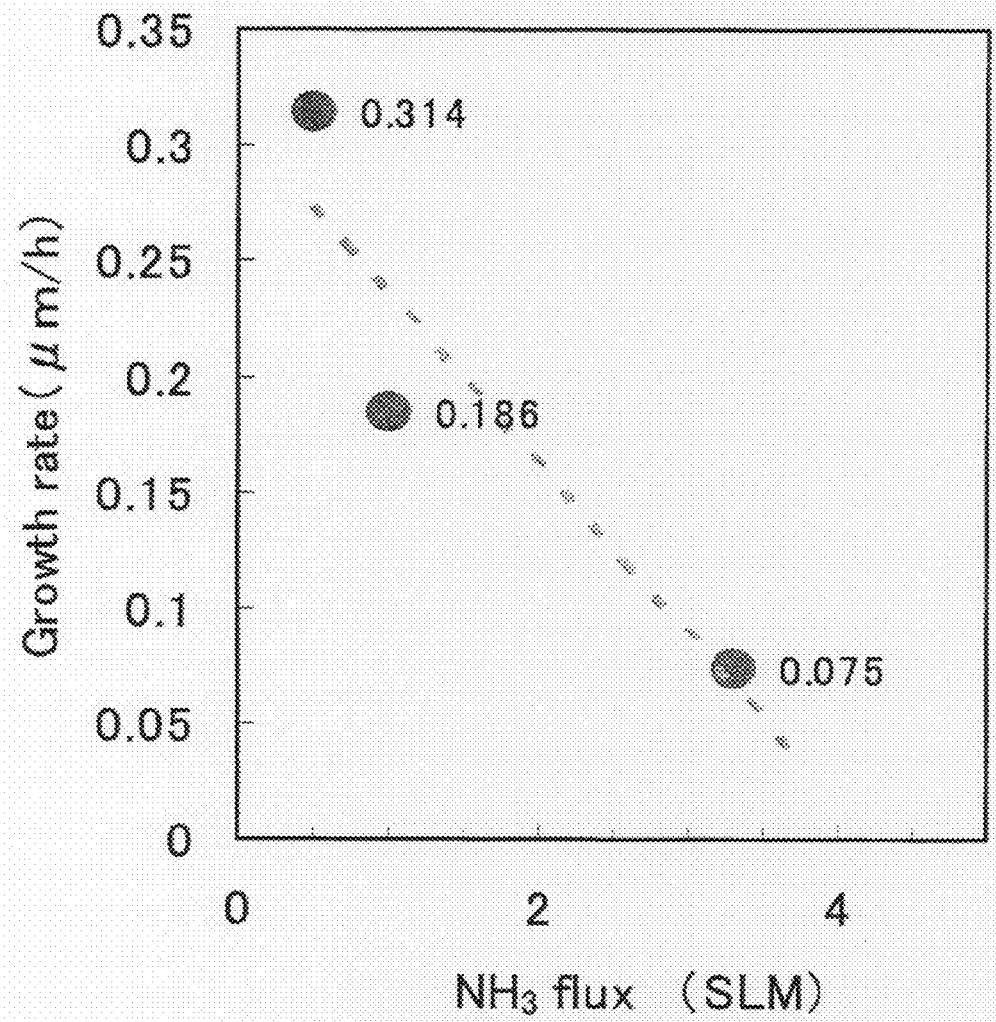
FIG. 6 is a graph showing a relation between a flux rate of $NH_3$ and a growth rate of AlGaInN layer.
Figure 7:
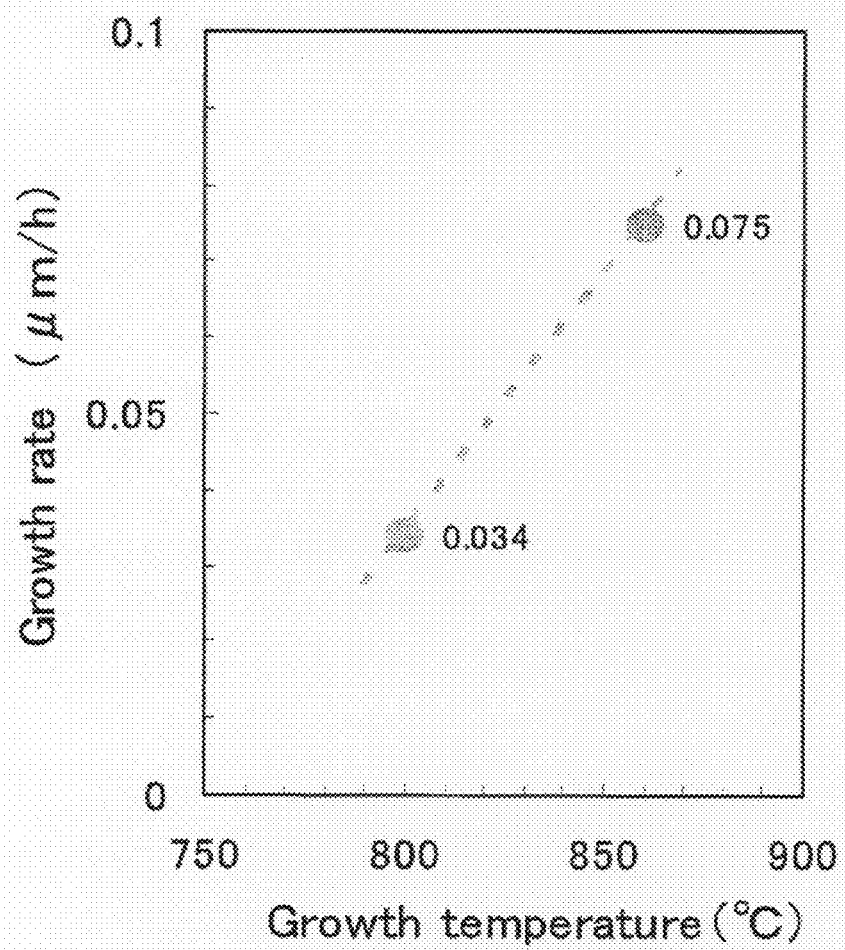
FIG. 7 is a graph showing a relation between a growth temperature and a growth rate of AlGaInN layer.

Some experiments are made to examine how the supply rate (flux rate) of $NH_3$ and substrate temperature individually affect the growth rate of $Al_aGa_bIn_{(1-a-b)}N$(0<a<1, 0<b<1, 1−a−b>0) layer. As a sample laminate to be provided thereon with the $Al_aGa_bIn_{(1-a-b)}N$(0<a<1, 0<b<1, 1−a−b>0) layer, the sapphire substrate 1 is formed with the first buffer layer 2, and the n-type nitride semi-conductor layer 3 which are superimposed in the same order as in FIG. 1. FIGS. 6 and 7 show variations of the growth rate, in relation to $NH_3$ flux rate and the substrate temperature (growth temperature), respectively, in growth of the $Al_aGa_bIn_{(1-a-b)}N(0<a<1, 0<b<1, 1-a-b>0)$ layer on the n-type nitride semi-conductor layer 3 of the sample laminate. Some numerals in FIGS. 6 and 7 show the growth rates. According to FIG. 6, as $NH_3$ flux rate increases from 0.5 SLM (500 SCCM) to 3.3 SLM (3300 SCCM), the growth rate decreases from 0.3 μm/h to 0.075 μm/h. According to FIG. 7, as the substrate temperature decreases from 860° C. to 800° C., the growth rate decreases from 0.075 μm/h to 0.034 μm/h. Therefore, the growth rate can be controlled by varying either the flux rate of $NH_3$ or the substrate temperature in growth of an $Al_aGa_bIn_{(1-a-b)}N(0<a<1, 0<b<1, 1-a-b>0)$ layer.

Figure 8:
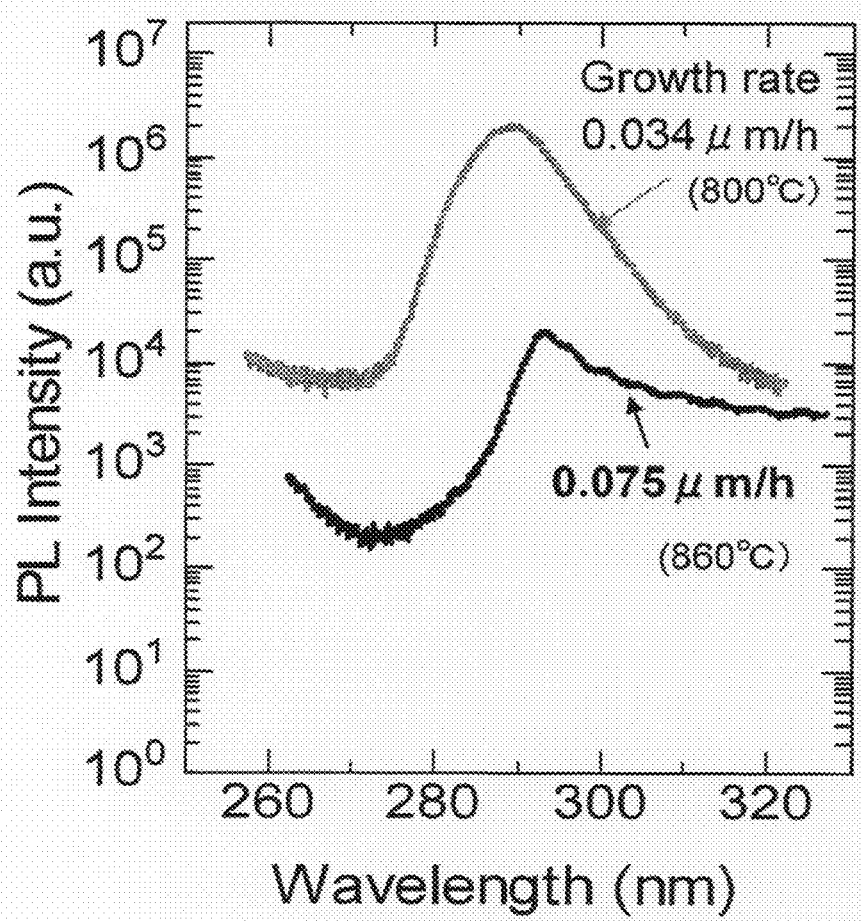
FIG. 8 shows photoluminescence spectra of AlGaInN layers which are grown at different growth rates (growth temperature).

As shown in FIG. 8, PL spectra are measured at room temperature for the $Al_aGa_bIn_{(1-a-b)}N(0<a<1, 0<b<1, 1-a-b>0)$ layers having thicknesses of 75 nm which are respectively grown at different growth rates of 0.075 μm/h (substrate temperature is set at 860° C.) and 0.034 μm/h (substrate temperature is set at 800° C.), in order to examine a relation between growth rate and luminescent characteristic of the AlGaInN layer. The AlGaInN layer grown at 0.034 μm/h gives PL intensity more than 100 times stronger than that grown at 0.075 μm/h. Therefore, the growth rate can be regulated by varying either the flux rate of $NH_3$ or the temperature in growth of an $Al_aGa_bIn_{(1-a-b)}N(0<a<1, 0<b<1, 1-a-b>0)$ layer, for the purpose of improving PL intensity.

In the nitride semi-conductor light emitting device of this embodiment, the light emission layer 6 and the p-type semi-conductor layer 7 are formed in accordance with the above process of fabricating a nitride semi-conductor layer of $Al_aGa_bIn_{(1-a-b)}N(0<a<1, 0<b<1, 1-a-b>0)$. Namely, the light emission layer 6 and the p-type semi-conductor layer 7 are grown at a growth rate less than 0.09 μm/h.

The above process of fabricating a nitride semi-conductor layer enables to suppress the generation of point-defects which significantly lowers quality of the light emission layer 6 and the p-type nitride semi-conductor layer 7, improving internal quantum efficiency and light output of the light emission layer 6 and electrical property of the p-type semi-conductor layer 7, thereby providing a nitride semi-conductor light emitting device formed of AlGaInN layer with high quality. In this embodiment, the above process is employed for fabricating both the light emission layer 6 and the p-type nitride semi-conductor layer 7, but may be employed for fabricating either the light emission layer 6 or the p-type nitride semi-conductor layer 7.

The nitride semi-conductor light emitting device in this embodiment is produced by the above process of fabricating nitride semi-conductor layer, in which the composition a in the $Al_aGa_bIn_{(1-a-b)}N$ layer is set at 0.3 or more. The nitride semi-conductor light emitting device exhibits a high quality, compared to a conventional light emitting device including $Al_aGa_bIn_{(1-a-b)}N$ layer ($a \geq 0.3$).

In this nitride semi-conductor light emitting device, the light emission layer is preferably set to emit light having its wavelength of 250 to 300 nm. In this invention, the nitride semi-conductor light emitting device acts as an UV LED alternative to a mercury lamp, excimer lamp, or the like.

The light emission layer 6 is formed of a multi quantum well structure or a single quantum well structure in this embodiment. But the light emission layer 6 may be formed as a single layer and interposed between the third buffer layer 5 and the first p-type nitride semi-conductor layer of p-type nitride semiconductor layer to formed a double hetero structure. It is noted that many widely different embodiments may be made in accordance with the technical concept of the present invention, and therefore the present invention should not be limited to the specific embodiments except as defined in the claims.

The single crystal substrate 1 of the nitride semi-conductor light emitting device is formed of sapphire substrate in this embodiment, but may be made of spinel substrate, silicon substrate, silicone carbonate substrate, zinc oxide substrate, gallium-phosphorus substrate, gallium-arsenic substrate, magnesium oxide substrate, zirconium-boron substrate, or group III nitride semi-conductor crystal substrate.

The invention claimed is:

1. A process of fabricating a nitride semi-conductor light emission layer of AlGaInN that is set to emit light having its wavelength of 250 to 300 nm,
    said nitride semi-conductor light emission layer comprising a well layer of $Al_aGa_bIn_{(1-a-b)}N(0<a<1, 0<b<1, 1-a-b>0)$ and a barrier layer of $Al_cGa_dIn_{(1-c-f)}N(0<e<1, 0<f<1, 1-e-f>0, e>a)$,
    wherein said well layer is fabricated by growing at a growth rate less than 0.09 μm/h according to the metal organic vapor phase epitaxy (MOVPE) method, and
    wherein said barrier layer is fabricated by growing at a growth rate less than 0.09 μm/h according to the metal organic vapor phase epitaxy (MOVPE) method.

2. A process of fabricating a nitride semi-conductor light emitting device,
    wherein said process comprises steps of fabricating a p-type nitride semiconductor layer, an n-type nitride semiconductor layer, and said light emission layer therebetween;
    wherein said light emission layer is formed according to the process as defined in claim 1.

3. The process of fabricating a nitride semi-conductor light emitting device according to claim 2,
    wherein said p-type nitride semiconductor layer of $Al_cGa_dIn_{(1-c-d)}N(0<c<1, 0<d<1, 1-c-d>0)$ layer is fabricated by growing at a growth rate less than 0.09 μm/h according to the metal organic vapor phase epitaxy (MOVPE) method.

4. The process of fabricating said nitride semi-conductor light emission layer as set forth in claim 1,
    wherein said well layer of $Al_aGa_bIn_{(1-a-b)}N(0<a<1, 0<b<1, 1-a-b>0)$ is fabricated by growing at a growth rate equal to or less than 0.03 μm/h according to the metal organic vapor phase epitaxy (MOVPE) method, and
    wherein said barrier layer of $Al_cGa_fIn_{(1-c-f)}N(0<e<1, 0<f<1, 1-e-f>0, e>a)$ is fabricated by growing at a growth rate equal to or less than 0.03 μm/h according to the metal organic vapor phase epitaxy (MOVPE) method.

5. The process of fabricating said nitride semi-conductor light emission layer as set forth in claim 1,
    wherein said growth rates of said well layer and said barrier layer are controlled by varying the flux rate of $NH_3$ or a substrate temperature during the growth of the layers.

* * * * *